Jan. 18, 1966 W. R. HUBBARD 3,229,939

MOUNTING GROMMET FOR ELECTRICAL COMPONENTS

Filed Nov. 22, 1963 3 Sheets-Sheet 1

*INVENTOR.*
WILLIAM R. HUBBARD

MOUNTING GROMMET FOR ELECTRICAL COMPONENTS

Filed Nov. 22, 1963

3 Sheets-Sheet 2

INVENTOR.
WILLIAM R. HUBBARD

INVENTOR.
WILLIAM R. HUBBARD

United States Patent Office 3,229,939
Patented Jan. 18, 1966

3,229,939
MOUNTING GROMMET FOR ELECTRICAL COMPONENTS

William R. Hubbard, Garden Grove, Calif., assignor to North American Aviation, Inc.

Filed Nov. 22, 1963, Ser. No. 325,534
2 Claims. (Cl. 248—27)

This invention relates to mountings for electrical devices, and more particularly to mountings for transistors.

Transistors are generally mounted on circuit boards or chassis with epoxy resins or by having the transistor leads soldered to circuit terminals. The mounting means now employed do not lend themselves to easy removal of faulty components nor do they offer any degree of protection to vibration or severe shock.

It is, therefore, an object of this invention to provide a means for mounting electrical components, such as transistors or the like, to circuit boards and chassis.

It is also an object of this invention to provide a mounting means which allows for easy removal of the mounted element.

It is further object of this invention to provide a resilient mount that will protect a mounted component from severe shocks.

It is also a further object of this invention to supply an economical, neat and orderly means for mounting transistors in apertures.

It is still a further object of this invention to provide a mounting means for electrical components, or the like, which has a color code which characterizes the type or size of component to be mounted in order to facilitate circuit assembly time.

It is yet a further object of this invention to mount transistors or other objects in apertures of circuit boards or similar sheet stock. These, together with other objects and features will become more apparent from consideration of the following detailed description of one embodiment of the invention when read with reference to the accompanying drawings in which.

Figure 1:
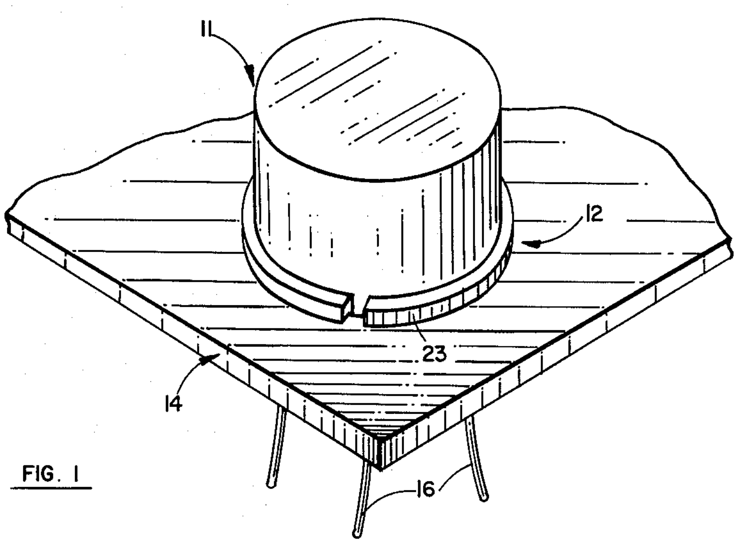
FIGURE 1 is a top perspective view of the transistor mounting means securing a component to a circuit board.
Figure 2:
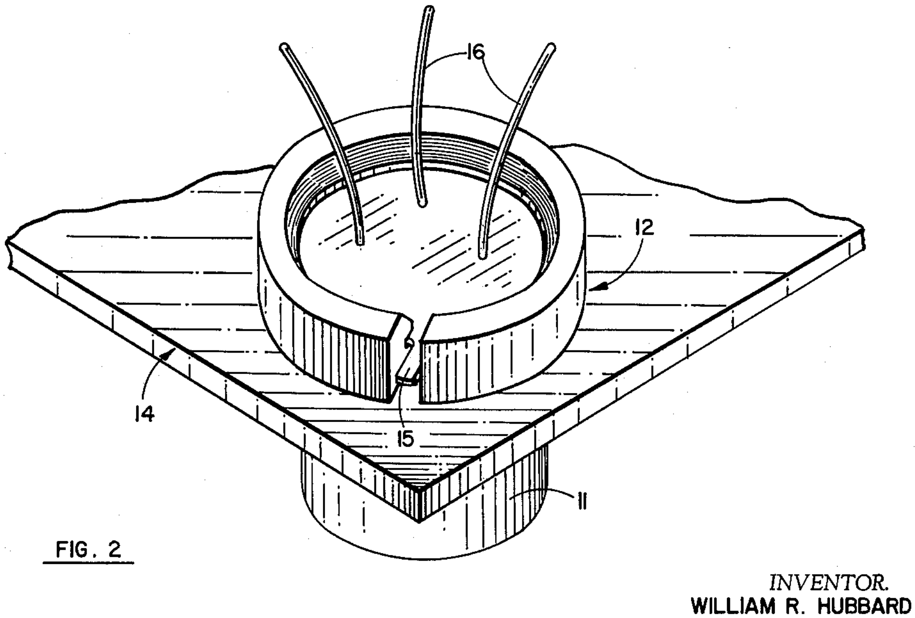
FIGURE 2 is a bottom perspective view of the assembly shown in FIGURE 1.
Figure 3:
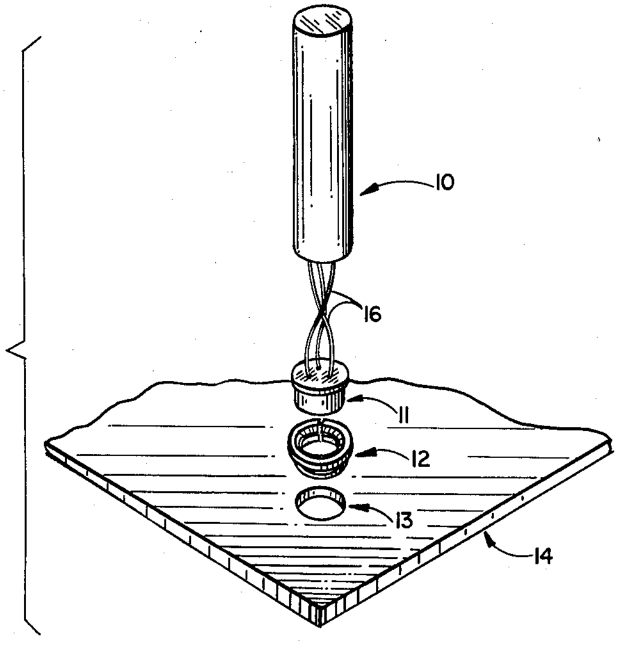
FIGURE 3 is an exploded view of the mounting means in relation to a circuit board, mounted component, and mounting tool.

In referring to FIGURE 3, the circuit board 14 defines an aperture 13 in which a transistor 11 is to be secured with mounting means 12. The insertion tool 10 is a means by which pressure is applied to transistor 11 to force it into place within mounting means 12.

By hollowing out tool 10 to accept transistor leads 16, the leads are protected from crimping or bending when the tool 10 is butted against transistor 11 during the insertion process.

Figure 4:
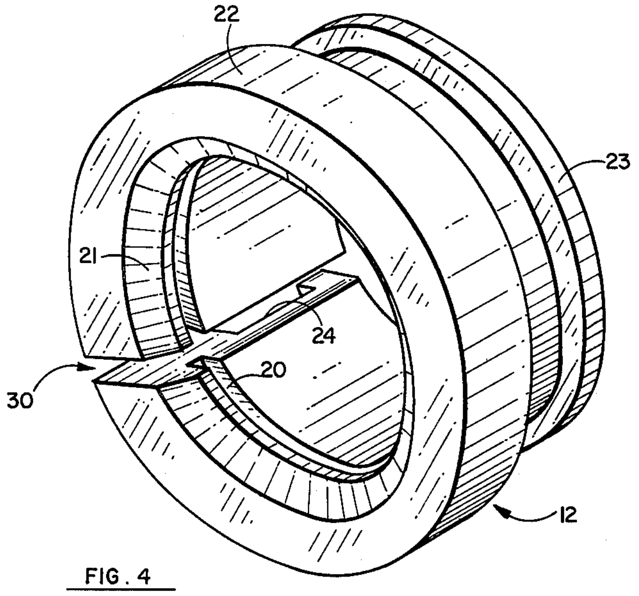
FIGURE 4 is a perspective view of the mounting means.
Figure 5:
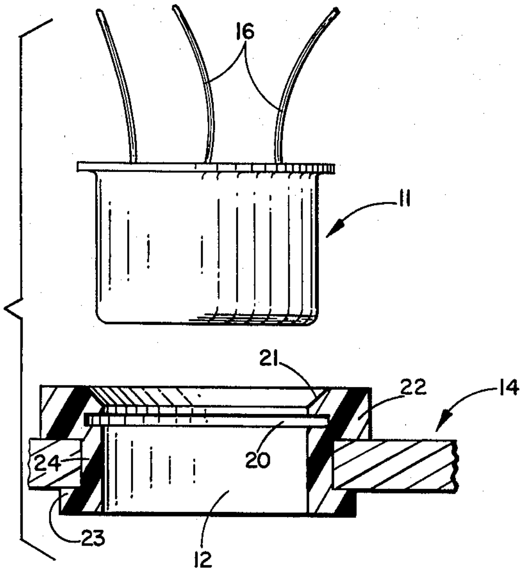
FIGURE 5 is a cross-sectional view of the mounting means and a circuit board, showing the relative position of a typical transistor before insertion.
Figure 7:
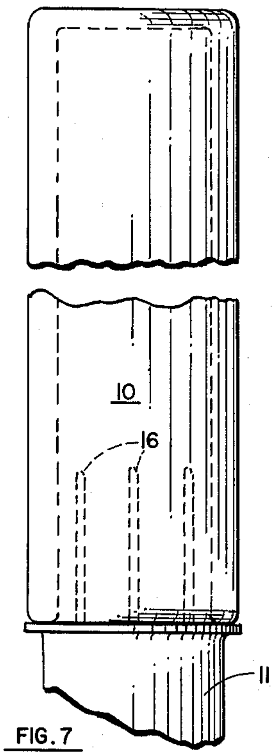
FIGURE 7 is an enlarged fragmentary view of FIGURE 3, showing the internal construction of the insertion tool and its alignment with respect to a typical transistor.
Figure 6:
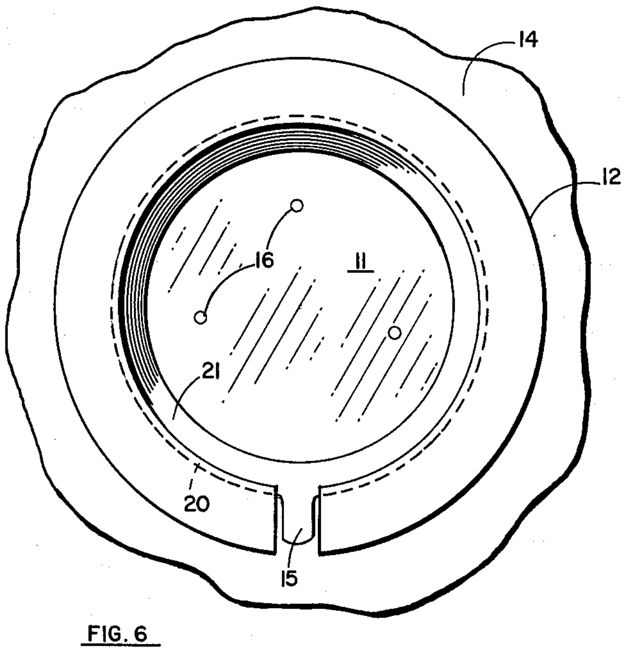
FIGURE 6 is an enlarged fragmentary view of FIGURE 2.

Referring particularly to FIGURES 4, 5, and 6, mounting means (grommet) 12 is made of a resilient plastic material, which is formed as one integral part having the shape of a hollow circular cylinder 24 with two preferably flat annular projecting rims 22 and 23 on its outer periphery.

To add structural rigidity to mounting grommet 12, to ensure a firm seat upon the face of circuit board 14, and to prevent the mounting grommet 12 from being forced completely through the circuit board 14 during the insertion process, rim 22 is made in a larger diameter and width than rim 23.

Rim 23 is spaced a predetermined distance from rim 22. The thickness of circuit board 14 or any other chassis used determines the spacing needed between rims 22 and 23. The tolerance on such spacing should be enough to ensure a firm seating of rims 22 and 23 on the outer surfaces of the circuit board 14 without distortion of rims 22 and 23 or circular cylinder 24.

An annular groove 20 located on the inner periphery of cylindrical member 24 engages the flange on transistor 11 locking transistor 11 within mounting grommet 12 when pressure is applied to transistor 11 to insert it into mounting grommet 12. In a preferred embodiment, mounting grommet 12 has a chamfer 21 which aids the insertion process. The annular chamfer 21 performs the function of a wedge which allows the grommet material to be easily compressed between transistor 11 and circuit board 14.

The longitudinal slit 30 allows mounting grommet 12 to compress in diameter when inserted into aperture 13 and then to expand to snap into place with projecting rim 22 on one face of circuit board 14 and projecting rim 23 on the opposite face locking the mounting grommet 12 in place. Slit 30 also allows the transistor key lug 15 to move longitudinally within the mounting grommet 12 during the assembly and prevents any rotational motion of the transistor 12 within the grommet.

In use, the mounting grommet 12 is inserted into aperture 13 until the projecting rim 23 snaps into place on the face of circuit board 14. Transistor 11 is then aligned along the chamfered edge of the grommet as shown in FIGURE 5 with the key 15 directly above slit 30. The insertion tool 10 is placed, with the leads 16 inside, butting transistor 11. Pressure is then applied to tool 10 to force the transistor 11 into mounting grommet 12 such that the flange on transistor 11 fits into groove 20. Transistor 11 may be removed for replacement by applying pressure with tool 10 to the opposite end of transistor 11.

The resilient nature of the plastic material used to form the mounting grommet provides a shock absorbing or damping action to protect the transistor. The plastic may be color coded for ease of matching mounting grommets to various size transistors.

It is to be noted that although the specification and drawings show a transistor as the component to be mounted it is obvious that the nature of the mounted device is not important and that any device that can be supported by the mounting grommet 12 can be used.

Although the invention has been described and illustrated in detail, it is to be understood that the same is by way of illustration and example only and is not to be taken by way of limitation, the spirit and scope of this invention being limited only by the terms of the appended claims.

I claim:

1. In combination, a flat member having a circular aperture, mounting means for mounting a cylindrical housing having a peripheral flange, said mounting means comprising a hollow cylindrical member, said member having two annular projecting rims on the outer periphery thereof, said rims being spaced a distance substantially the same as the depth of said flat member and positioned on opposite sides of said flat member in said aperture, one end of said cylindrical member having an inwardly tapered portion defining an entry for said housing, and a groove on the inner surface of said cylindrical member adjacent said entry end for positioning the flange of the housing.

2. Mounting means comprising a resilient cylindrical member having an inner surface defining an aperture having constant inner diameter throughout the length of said member so as to position therethrough a housing having substantially the same diameter and an annular flange, two annular projecting rims extending outwardly from opposite ends of said cylindrical member for mounting said member in an opening and an annular chamfer on the inner periphery of said cylindrical member to define an entry and an annular groove on said inner surface adjacent said entry end of said cylindrical member to receive said flange.

References Cited by the Examiner

UNITED STATES PATENTS

| | | | |
|---|---|---|---|
| 2,291,430 | 7/1942 | Ingersoll | 174—154 |
| 2,948,773 | 8/1960 | Hawes | 174—153 |
| 3,067,974 | 12/1962 | Baldwin | 248—27 |

CLAUDE A. LE ROY, *Primary Examiner.*

J. PETO, *Assistant Examiner.*